United States Patent [19]

Tanaka

[11] Patent Number: 4,572,973

[45] Date of Patent: Feb. 25, 1986

[54] AC CURRENT DETECTION CIRCUIT FOR A ROTOR DRIVING SUPPLY SOURCE OF A ROTATING ANODE X-RAY TUBE

[75] Inventor: Shigeru Tanaka, Ootawara, Japan

[73] Assignee: Tokyo Shibaura Denki Kabushiki Kaisha, Kawasaki, Japan

[21] Appl. No.: 456,850

[22] Filed: Jan. 10, 1983

[30] Foreign Application Priority Data

Jan. 13, 1982 [JP] Japan .................. 57-2877

[51] Int. Cl.$^4$ .............. H03K 5/153; H03K 5/159; H03K 3/30
[52] U.S. Cl. .................. 307/350; 307/354; 307/282
[58] Field of Search .......... 307/282, 350, 273, 354, 307/314, 309, 522, 351, 360, 362, 363, 297; 328/120

[56] References Cited

U.S. PATENT DOCUMENTS

| | | | |
|---|---|---|---|
| 3,553,491 | 1/1971 | Schulz | 307/360 |
| 3,944,936 | 3/1976 | Pryor | 307/354 |
| 3,999,087 | 12/1976 | Compton | 307/273 |
| 4,126,795 | 11/1978 | Moorey | 307/282 |
| 4,153,848 | 5/1979 | Miyazaki | 307/354 |
| 4,153,850 | 5/1979 | Boyer | 307/354 |
| 4,311,924 | 1/1982 | Breck et al. | 307/354 |
| 4,346,375 | 8/1982 | Billings | 307/363 |

Primary Examiner—Stanley D. Miller
Assistant Examiner—Timothy P. Callahan
Attorney, Agent, or Firm—Cushman, Darby & Cushman

[57] ABSTRACT

An AC current detection circuit is intended to detect whether an AC induction current for the rotor of the rotating anode X-ray tube flows or not. A current transformer is employed in the rotor supply circuit to generate a lower voltage at its output circuit by utilizing its magnetic-electric conversion effect. A transistor will switch on-off by receiving the generated voltage and produce a series of output pulse signals. A retriggerable monostable multivibrator will detect a missing pulse from the output pulse signals, which indicates a failure of the rotor supply operation.

3 Claims, 5 Drawing Figures

AC CURRENT DETECTION CIRCUIT FOR A ROTOR DRIVING SUPPLY SOURCE OF A ROTATING ANODE X-RAY TUBE

BACKGROUND OF THE INVENTION

1. Field of the Invention

This invention generally relates to an AC current detection circuit used in an X-ray apparatus and, more particularly, to an AC current detection circuit for a rotor driving supply source of a rotating anode X-ray tube.

2. Description of the Prior Art

In a conventional detection circuit of this kind mentioned in this preamble, a detecting resistor having a considerably low resistance is interposed between an AC rotor driving supply source and a stator coil of a rotating anode X-ray tube. The resultant AC detection voltage built-up across the detection resistor is rectified through a Zener diode bridge to obtain the lower DC detection voltage at the output of the bridge. Accordingly, the AC current in the rotor driving supply source can be detected by controlling a relay connected to the output of the bridge. However, in a circuit such as an AC rotor driving supply source for a rotating anode X-ray tube, the load has inductive characteristics and a voltage to be applied to the load must be varied (e.g., during the starting period of the rotor, a starting voltage which is about twice the drive voltage is applied to the stator coil). Elements of large power dissipation is then required for measurements of the AC current detection circuit, and also a great power loss is caused by the detecting resistor.

SUMMARY OF THE INVENTION

It is an object of the present invention to provide an AC current detection circuit for a rotor driving supply source of a rotating anode X-ray tube, which is capable of suppressing occurence of the power loss in a primary circuit connecting a rotor driving supply source and a stator coil of a rotating anode X-ray tube by electrically insulating the AC current detection circuit from the primary circuit, and which is compact in size and is capable of operation with an AC current of relatively large amplitude flowing through the primary circuit.

An AC current detection circuit for a rotor driving supply source of a rotating anode X-ray tube according to the invention comprises:

magnetic-electric converting means which is magnetically coupled to and also electrically insulated from the rotor driving supply source and which generates AC current signals in its output circuit in response to the AC rotor driving current;

switching means connected to the output circuit of the magnetic-electric converting means and periodically generating a series of pulse signals only when the AC current signals flowing through the output circuit exceed a predetermined level; and pulse detection means connected to receive the pulse signals derived from the switching means and detecting whether the AC current signals in the output circuit exceed the predetermined level or not.

It is an advantage that since the detection circuit in accordance with the present invention is operable under the lower supply voltage, it can detect AC current with elements of smaller power dissipation. Accordingly, the AC current detection circuit in accordance with the present invention may be constructed small in size and save the manufacturing cost. Since the detection circuit of the present invention operates at a low supply voltage, it is free of troubles and thus highly reliable.

BRIEF DESCRIPTION OF THE DRAWINGS

The invention is best understood by reference to the accompanying drawings, in which.

DETAILED DESCRIPTION OF THE PREFERRED EMBODIMENTS

Figure 1:
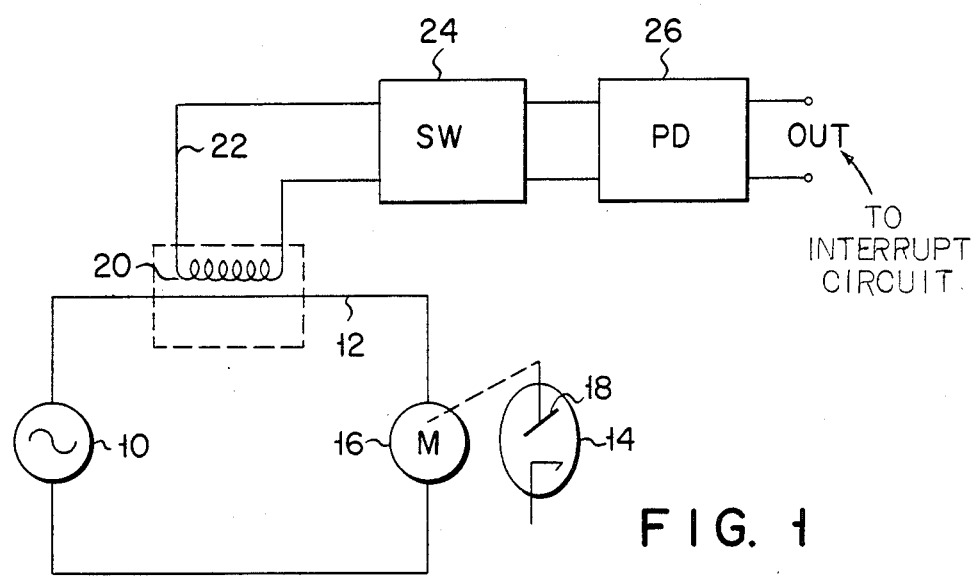
FIG. 1 is a block diagram schematically illustrating the principle of the invention.

FIG. 1 is a block diagram schematically showing the basic configuration for explaining the principle of an AC current detection circuit according to the present invention.

Referring to FIG. 1, a rotor driving supply source 10 is connected to a stator coil (not shown in detail) 16 of a rotating anode X-ray tube 14 through a primary power line 12. The X-ray tube 14 of rotating anode type is used, which will be referred to "primary circuit". A rotor (not shown in detail) connected to an anode 18 is capable of rotating at a given speed by a rotary magnetic field generated by the stator coil 16. As the structure of the rotating anode X-ray tube is well known, further explanation will be omitted.

A magnetic-electric converting means 20 is magnetically coupled to a part of the primary power line 12. A given electro-magnetically induced voltage is generated at an output circuit 22 of the converting means 20. The electro-magnetically induced voltage is applied to a switching means 24. In response only to a given magnetically induced voltage signal, the switching means 24 is activated to generate periodically pulse signals. The periodic pulse signals are supplied to a pulse signal detection circuit 26 connected to a later stage. Whether the periodic pulse signals come or not is descriminated by the detection circuit 26 and an output signal therefrom may indicate such a fact by inverting the polarity of the output signal.

More specifically, when the stator coil 16 of the rotating anode 18 is energized by the driving supply source 10, a certain driving AC current flows through the primary power line 12 to the stator coil 16. An alternating magnetic field of a given intensity is generated by this AC current, which can generate an electro-magnetically induced voltage in the output circuit 22 of the magnetic-electric converting means 24 which is magnetically coupled to the primary circuit. The converting means 20 is so designed that the induced voltage will have a given lower value if a normal primary AC current flows. Therefore, as long as the induced voltage having the given value is generated, the periodic pulse signal is generated from the switching means 24. Then, the pulse signal detection circuit 26 can detect flow of a given AC current to the primary circuit. If the rotating anode 18 cannot rotate for some reason, there is possibility of trouble, such as burning of the anode. In order to prevent this, no supply voltage to the stator coil 16 must be immediately detected so as to interrupt application of a high voltage to the X-ray tube 14. Thus, when the AC voltage applied to the stator coil 16 decreases to a low value or to zero, the induced voltage also decreases in proportion to the magnitude of such a decrease. Then, the switching means 24 stops its switching operation and does not produce any more periodic pulse signals. The output signal from the pulse signal detection circuit 26 is inverted to indicate such a fact that the supply of the AC current has been interrupted.

Figure 2:
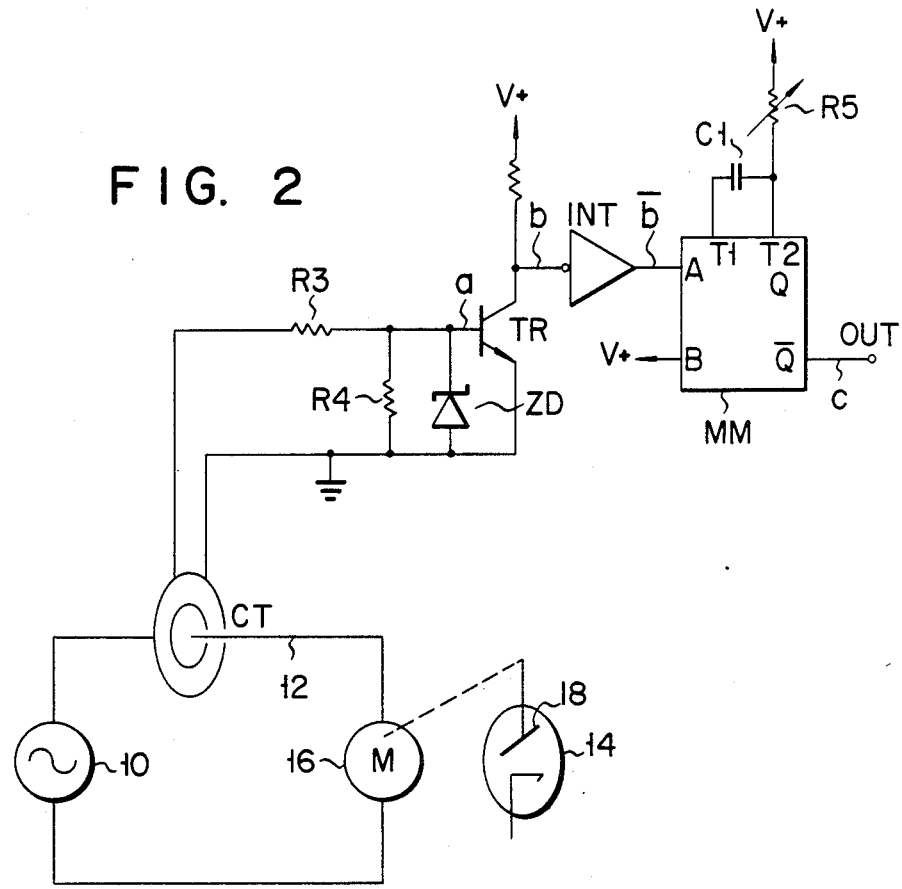
FIG. 2 schematically shows a circuit diagram of an AC current detection circuit according to the invention.
Figure 3:
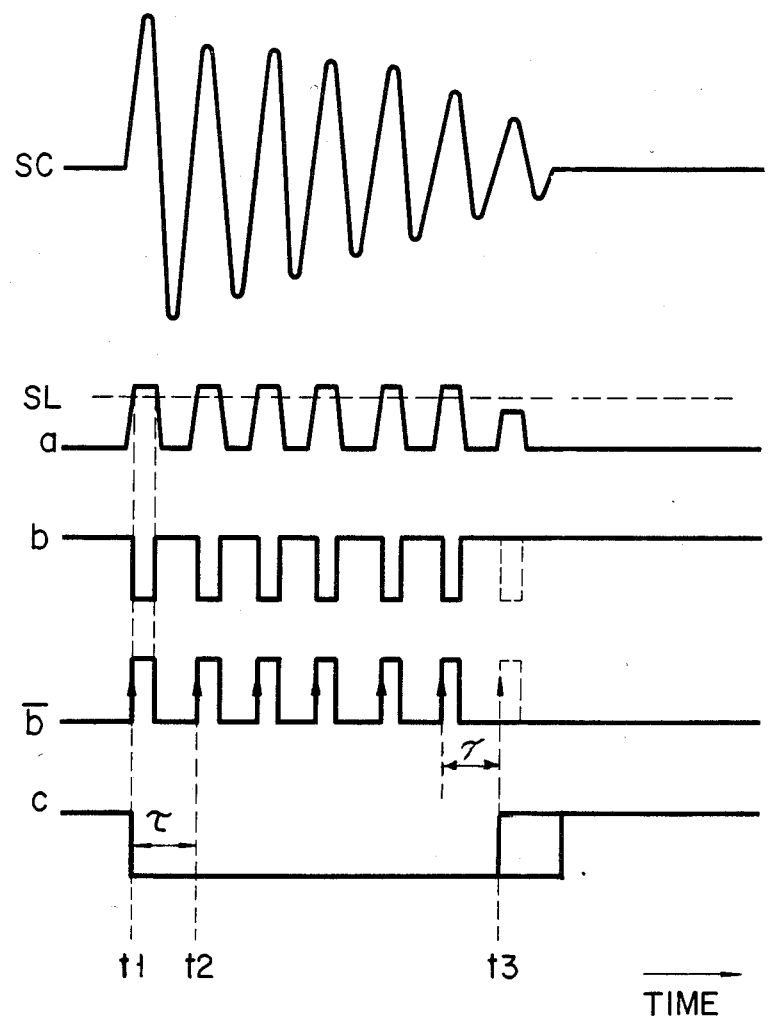
FIG. 3 shows a voltage waveform chart of each node for illustrating the operation of the detection circuit shown in FIG. 2.

FIG. 2 is a circuit diagram of an AC current detection circuit according to the present invention, and FIG. 3 shows timing charts for explaining the mode of operation of the circuit shown in FIG. 2.

Referring to FIG. 2, the AC current detection circuit mainly comprises a current transformer CT (corresponding to the magnetic-electric converting means 20 in FIG. 1), an emitter-grounded transistor TR (corresponding to the switching means 24 in FIG. 1) of which base is connected to the current transformer CT, and a retriggerable monostable multivibrator MM (corresponding to the pulse signal detection circuit 26 in FIG. 1) to which the collector of the transistor TR is connected through an inverter INT.

Figure 4:
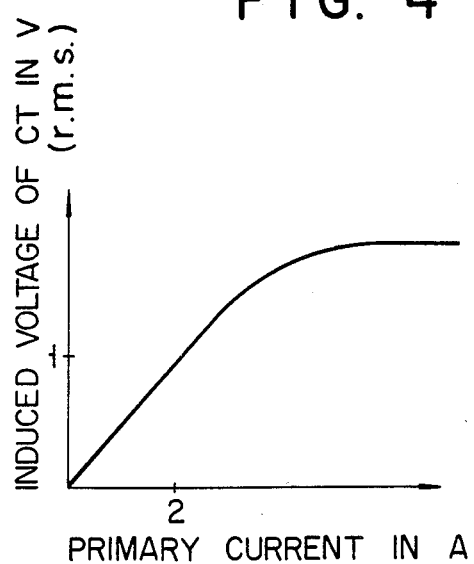
FIG. 4 is a characteristic curve of the current transformer of FIG. 2.

More specifically, the current transformer CT has a coil (not shown in detail) which is magnetically coupled to and also insulated from a primary power line 12 between a rotor driving supply source 10 and a stator coil 16 as a load. The coil induces an AC voltage in its output circuit by a primary AC current. The AC voltage induced in this magnetical-electric converting manner has a considerably low value. For example, a voltage of 1 V r.m.s. is induced by an AC current of 2 [A]. Furthermore, since the current transformer CT has a saturation characteristic as shown in FIG. 4, the output AC voltage becomes relatively low even if a large current flows into the primary circuit. As for the characteristic curve of the current transformer CT, the gradient angle with respect to the abscissa of the curve shown in FIG. 4 becomes smaller by setting a resistance of a resistor R4 small. Selection of the resistance of the resistor R4 is determined by the conditions on the operation characteristics of the switching transistor TR. A resistor R3 is series-connected between the base of the transistor TR and the current transformer CT. The resistor R4 and a Zener diode ZD are connected in parallel with each other between the resistor R3 and the base of the transistor TR. The transistor TR receives the voltage appearing at a node "a" (simply referred to as "voltage a") obtained by cutting the induced negative-going voltage and a positive-going voltage which is higher than a given value by the Zener diode ZD. The transistor TR produces a given pulse voltage appearing at a node "b" (simply referred to "voltage b") by the switching operation on the basis of a reference voltage SL which is determined by the resistors R3 and R4.

The retriggerable monostable multivibrator MM receives an output pulse voltage appearing at a node "b̄" (simply referred to as "voltage b̄") which is obtained by inverting the pulse "voltage b" from the transistor TR by means of the inverter INT. This monostable multivibrator MM is designed to be retriggered by the positive-going edge of "the voltage b̄". As is known the monostable multivibrator MM is returned to the original state after its time constant τ determined by an externally connected resistor R5 and capacitor C1 elapses from its last triggering timing. The output terminal of the monostable multivibrator MM is connected to an indicator circuit or an interlock circuit (not shown) to indicate whether the AC current flows in the primary circuit or to cut off the X-ray radiation control circuit (not shown).

The mode of operation of the AC current detection circuit as described above will now be described in further details with reference to the timing charts shown in FIG. 3.

When an AC current SC as shown in FIG. 3 flows into the primary circuit consisting of the rotor driving supply source 10 and the stator coil 16, a voltage corresponding to the primary circuit current or the AC current SC is induced in the output circuit of the current transformer CT. The "voltage a" as shown in FIG. 3 is applied to the base of the transistor TR. The "voltage a" is obtained by cutting the positive-going voltage higher than a predetermined voltage and also cutting the negative-going voltage by the Zener diode ZD and/or the saturation characteristics of the current transformer CT. The transistor TR is switched in accordance with the reference voltage SL which is determined by the resistors R3 and R4. The transistor TR produces at its collector the collector pulse "voltage b" as shown in FIG. 3. That is, the transistor TR begins to conduct when the base input "voltage a" exceeds the reference voltage SL, and ceases to conduct when it drops to the reference voltage SL. The pulse voltage b is inverted by the inverter INT and the inverted voltage is applied to the monostable multivibrator MM. The pulse widths of the pulse "voltages b and b̄" change in accordance with the primary circuit current but are in synchronism with the source frequency of the primary circuit. Accordingly, if the time constant τ of the monostable multivibrator MM which is determined by the externally connected resistor R5 and the capacitor C1 is set to be the same or slightly longer than the period of the primary circuit current, as this retriggerable monostable multivibrator MM is triggered first to change its output state into the low level, and thereafter is continued to be retriggered at every elapse of the time constant τ, the output state of the monostable multivibrator MM does not change i.e., maintain in the lower state (time t1 to t3 in FIG. 3). This means that the primary circuit, i.e., the rotor of the X-ray tube is normally operated while the retrigger action is performed in this manner.

When the AC current is interrupted for some reason such as a power failure of the power supply source, the input voltage to the transistor TR becomes lower than the reference voltage SL. The output "voltage b̄" from the inverter INT goes to a low level. Therefore, the monostable multivibrator MM returns to the original state and produces an output voltage of high level (time t4 in FIG. 3) after a predetermined time constant τ elapses from the given time (t3 in FIG. 3) at which the monostable multivibrator MM would be retriggered originally. This indicates that the rotor of the X-ray tube stops its rotation.

It should be noted that precisely speaking, although the interrupting time of the supply AC voltage is actually earlier than the time t3, as it is sufficiently earlier than the rotating time caused by the inertial force of rotation of the rotor, the time t3 may be regarded as the interrupting time of the AC power supply. In this manner, the start time t1 and the interrupting time t3 of the AC current supply may be effectively detected.

If the primary circuit is one which will cause a trouble or an accident when the X-ray tube is operated without supplying an AC current to the stator coil, in advance the AC current detection circuit should be connected thereto, and the output terminal of the monostable multivibrator should be connected to the interlock or indicator circuit (not shown). As a result, an interlock may be easily effected by a set output voltage appearing at a node "c", or an alarm signal may be produced by the indicator.

Figure 5:
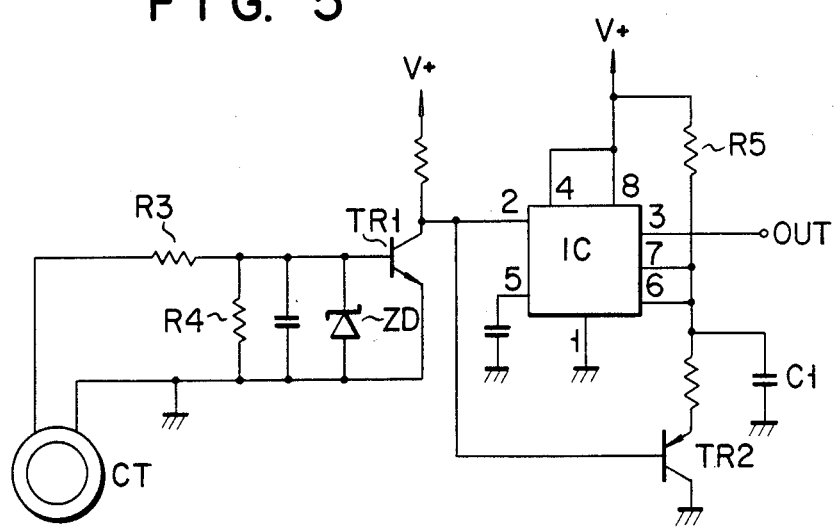
FIG. 5 is a circuit diagram of another detection circuit according to the invention.

FIG. 5 shows a circuit diagram of another embodiment. For the sake of simplicity, the primary circuit for the current transformer CT is omitted in this drawing. The input voltage limiting function of resistors R3 and R4 and a Zener diode ZD is the same as that of the first embodiment. A transistor TR1 serves as the switching means, while a transistor TR2 serves as a part of the retriggering means. In this circuit, the retriggerable monostable multivibrator comprises a multivibrator IC and the transistor TR2. The output voltage from the transistor TR1 is directly applied on an input pin 2 of the multivibrator IC without inversion by an inverter or the like as mentioned in the previous embodiment.

The values and the model Nos. of the main components of this embodiment are as follows:

TABLE 1

| Current transformer CT | CTL-6-S |
|---|---|
| Resistor R3 | 2K ohms |
| Resistor R4 | 15K ohms |
| Resistor R5 | 560K ohms |
| Capacitor C1 | 0.1 μF |
| Zener diode ZD | 05Z5.6 |
| Transistor TR1 | 2SC372 |
| Transistor TR2 | 2SA495 |
| Multivibrator IC | NE555 |

In the circuit of this embodiment, the output voltage of the current transformer CT is about 4.5 V, and is clipped to about 5.5 V by the Zener diode ZD. The reference voltage is determined to be about 4.0 V by the resistor R4. A time constant tc of the monostable multivibrator IC is given by; $tc \approx 1.1 \times R5 \times C1 \approx 61.6$ ms. The time constant tc is set to be longer than the period of the primary supply current (50 Hz=20 ms, 60 Hz≈16.7 ms).

In the circuit of the embodiment described above, a rotor driving supply source 10 supplies a boost voltage (200 V) which is approximately three times higher than the drive voltage (60 V) of the commercial frequency for about 2 to 3 seconds during the rotation start period of the rotor. This is for the purpose of shortening the rise time of the induction motor. However, the present invention is not limited to this. For example, in generally a high radiation X-ray tube, a boost voltage of 400 V and having the frequency of about 180 Hz higher than the commercial one is applied to rotate the anode at a high speed, and the drive voltage is about 200 V. The detection circuit of the present invention can be sufficiently operated under such a high supply voltage.

The voltage induced at the output circuit by utilizing the input/output characteristics of the current transformer CT does not become so high even if the primary supply voltage becomes high as described above. Therefore, the detection circuit of the present invention can be operated satisfactorily under such conditions so as to realize a more compact circuit and smaller power dissipation of each element.

According to the present invention, a current transformer is inserted in place of the detection resistor in the primary circuit as in the conventional circuit. Therefore, the AC current flowing through the primary circuit can be detected without causing adverse effects such as power loss of the primary circuit.

Although the present invention is described with reference to the preferred embodiments, the present invention is not limited to them. Various other changes and modifications may be conceived by those skilled in the art without departing the technical spirit and scope of the present invention.

For example, the transistor TR may be replaced by any switching element, such as a field effect transistor, which is capable of converting an output signal from the current transformer CT into periodic pulse signals.

The retriggerable monostable multivibrator MM may be replaced by a means, such as a known missing-pulse detector, which is capable of detecting a missing pulse from the periodic pulse signals.

If an AC current having a peak value higher than a given value flows into the primary circuit, by the reference voltage determined by the resistors R3 and R4, such a peak AC current may be detected. Further, it is evident to those skilled in the art that other magnetic-electric converting devices can be employed instead of the current transformer, such as Hall devices.

Although the Zener diode ZD is employed for clipping operation, it is also possible to substitute it by a normal diode.

What is claimed is:

1. A circuit for detecting an AC drive current of a rotor driving supply source for a rotating anode X-ray tube comprising:
    a current transformer, magnetically coupled to and electrically insulated from the rotor driving supply source, for producing in an output circuit thereof, a first AC voltage signal that is a function of both an amplitude of the AC rotor driving current and a saturation characteristic of said transformer;
    saturation circuit means, connected to the current transformer output circuit and including at least first and second resistors series connected to each other, for providing a second AC voltage signal across one of said first and second resistors that is lower in magnitude than said first AC voltage signal;
    voltage clipper means, connected to said saturation circuit means, for limiting said second AC voltage signal to a first predetermined voltage level to provide an AC clipped voltage;
    a switching element, connected to said clipper means, operative in response to said AC clipped voltage exceeding a second predetermined voltage level that is lower than said first predetermined voltage level; and
    retriggerable monostable multivibrator means, connected to the switching element, for providing a first output state when said AC clipped voltage is at least equal to said second voltage level and a second output state when said AC clipped voltage falls below said second voltage level, the output of said multivibrator being an indicator of the AC drive current.

2. A detection circuit according to claim 1 wherein said voltage clipper means comprises a Zener diode.

3. A detection circuit according to claim 1 wherein said switching element is a transistor.

* * * * *